United States Patent
Moriwaki (10) Patent No.: US 6,577,200 B2
(45) Date of Patent: Jun. 10, 2003

(54) HIGH-FREQUENCY SEMICONDUCTOR DEVICE

(75) Inventor: Takao Moriwaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,867

(22) Filed: Mar. 5, 2001

(65) Prior Publication Data

US 2002/0024391 A1 Feb. 28, 2002

(30) Foreign Application Priority Data

Aug. 30, 2000 (JP) ......................... 2000-261329

(51) Int. Cl.[7] ............. H03F 3/14; H03F 3/04; H01L 27/082; H01L 29/739
(52) U.S. Cl. ............ 330/307; 330/310; 257/579; 257/197
(58) Field of Search ............... 330/307, 310; 257/579, 197

(56) References Cited

U.S. PATENT DOCUMENTS

| | | | | |
|---|---|---|---|---|
| 4,072,979 A | * | 2/1978 | Palara | 257/580 |
| 4,297,597 A | * | 10/1981 | Kimura | 330/310 |
| 4,430,609 A | * | 2/1984 | Van Kessel et al. | 323/272 |
| 4,492,929 A | * | 1/1985 | Vyne | 33/288 |
| 4,791,382 A | * | 12/1988 | Shiomi et al. | 327/108 |
| 5,734,193 A | * | 3/1998 | Bayraktaroglu et al. | 257/197 |

FOREIGN PATENT DOCUMENTS

JP          11-102916          4/1999

OTHER PUBLICATIONS

Liu, William; "Failure mechanisms in AlGaAs/GaAs Power Heterojunction Bipolar Transistors", *IEEE Transactions on Electron Devices*, vol. 43, No. 2, pp. 220–227 (Feb. 1996).
Liu et al.; "The Collapse of Current Gain in Multi–Finger Heterojunction Bipolar Transistors: Its Substrate Temperature Dependence, Instability Criteria, and Modeling", *IEEE Transactions on Electron Devices*, vol. 41, No. 10, pp. 1698–1707 (Oct. 1994).

* cited by examiner

Primary Examiner—Patricia Nguyen

(57) ABSTRACT

A high-frequency semiconductor amplifier circuit minimizing deterioration of high-frequency characteristics and attaining high thermal stability. A driver stage of a power amplifier has a multi-stage configuration with multi-finger HBTs connected in shunt with each other, each multi-finger HBT having a single emitter. An output stage has a single stage configuration multi-finger HBTs connected in shunt with each other, each HBT including two emitters. As a result, while an increase in capacitance of a p-n junction between an emitter layer and a base layer of the driver stage is prevented, thermal nonuniformity arising in the output stage is minimized. Thus, a power amplifier as a whole is configured with high thermal stability without deterioration of a high-frequency characteristic of the power amplifier.

9 Claims, 8 Drawing Sheets

HIGH-FREQUENCY SEMICONDUCTOR DEVICE

BACKGROUND OF THE INVENTION

1. Field of the Invention

The present invention relates to a high-frequency semiconductor device, and more particularly, to an improvement in thermal stability of a multi-finger heterojunction bipolar transistor.

2. Description of the Related Art

Miniaturization is an important factor in promoting proliferation of portable terminals such as portable cellular phones. A high-output power amplifier has become a key part of a recent portable terminal.

A heterojunction bipolar transistor (hereinafter simply called "HBT") has a high current gain $\beta$. A GaAs-based HBT having an emitter made of AlGaAs and a base made of GaAs is characterized by its high speed and is widely used for a high-output power amplifier of a portable cellular phone.

In order to attain a high output, HBTs must be arranged in shunt with each other, to there by form a multi-finger configuration. An HBT having such a multi-finger configuration will hereinafter be referred to as a "multi-finger HBT," and individual HBTs constituting the multi-finger HBT will be called "basic HBTs."

Figure 8:
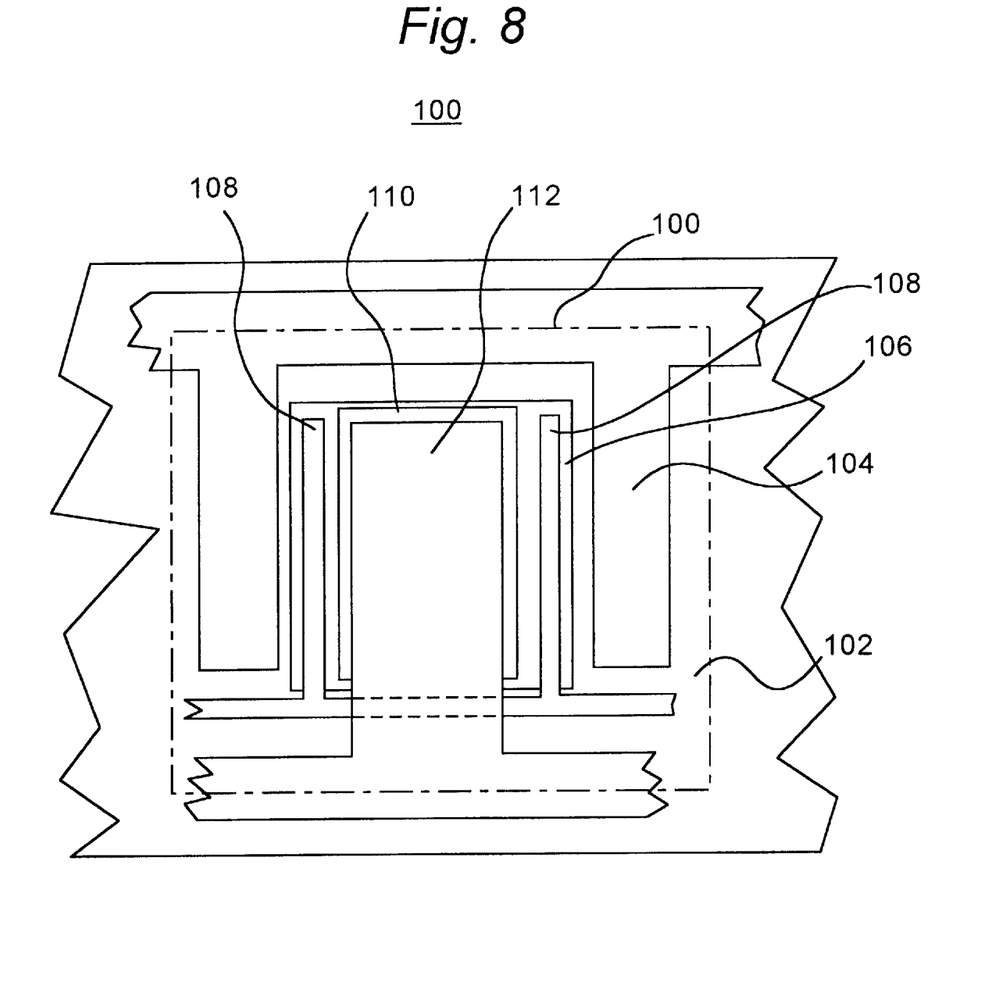
FIG. 8 is a plan view showing one of basic HBTs constituting a conventional high-output power amplifier.

FIG. 8 is a plan view showing one of basic HBTs constituting a conventional high-output power amplifier.

In connection with FIG. 8, reference numeral 100 designates a basic HBT; 102 designates a collector layer; 104 designates a collector electrode; 106 designates a base layer; 108 designates a base electrode; 110 designates an emitter layer; and 112 designates an emitter electrode.

In a case where a multi-finger HBT is activated, the current gain $\beta$ decreases with temperature. For this reason, in contrast with a homojunction bipolar transistor (for example, an Si bipolar transistor) having a current gain $\beta$ increasing with temperature, the multi-finger HBT is resistant to thermal runaway.

However, it has already been reported that, because thermal nonuniformity arises among basic HBTs 100 within the multi-finger HBT, concentrated flow of current to a certain basic HBT 100 arises, thereby inducing a rapid change in an operating current. For instance, there is a report on failure arising for this reason (IEEE Transactions on Electronic Devices, Vol. 43, No. 2, February 1996, pp. 220 to 227).

Effective countermeasure against such a rapid change in an operating current is a reduction in thermal resistance of the basic HBT 100.

Thermal resistance $\Theta TH$ is defined as $\Theta TH = \Delta Tj / \Delta P$, where Tj is junction temperature and P is power.

Figure 9:
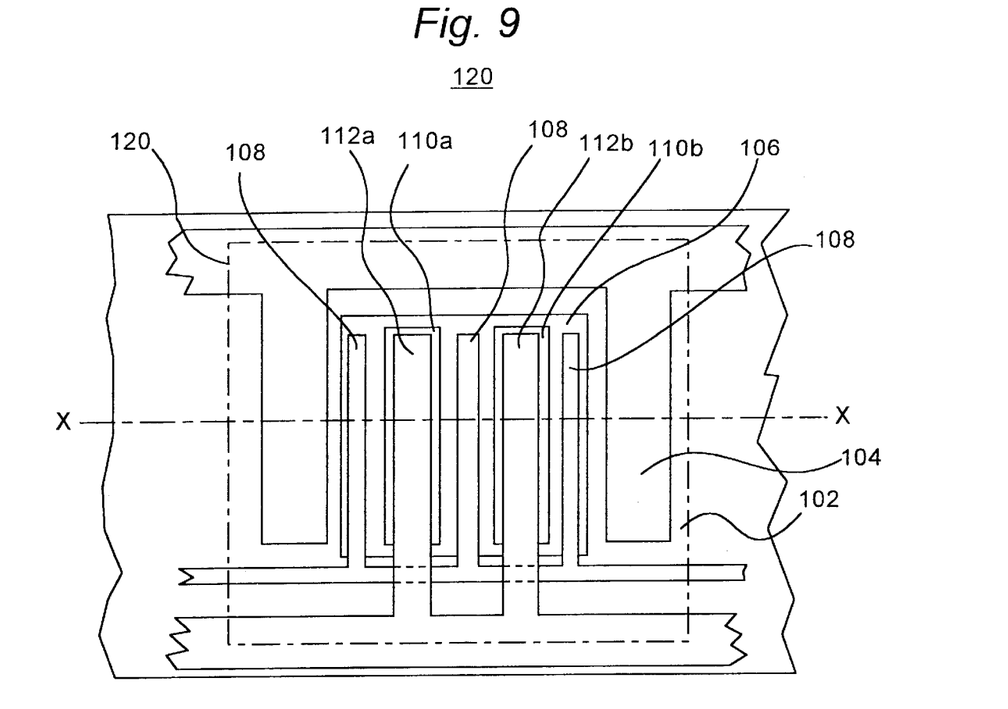
FIG. 9 is a plan view showing a basic HBT constituting another conventional high-output power amplifier.

FIG. 9 is a plan view showing a basic HBT constituting another conventional high-output power amplifier.

In connection with FIG. 9, reference numeral 120 designates a basic HBT consisting of two emitters; 110a and 110b designate split emitter layers constituting an emitter layer 110 of the basic HBT 120; and 112a and 112b are split emitter electrodes constituting an emitter electrode of the basic HBT 120.

Figure 10:
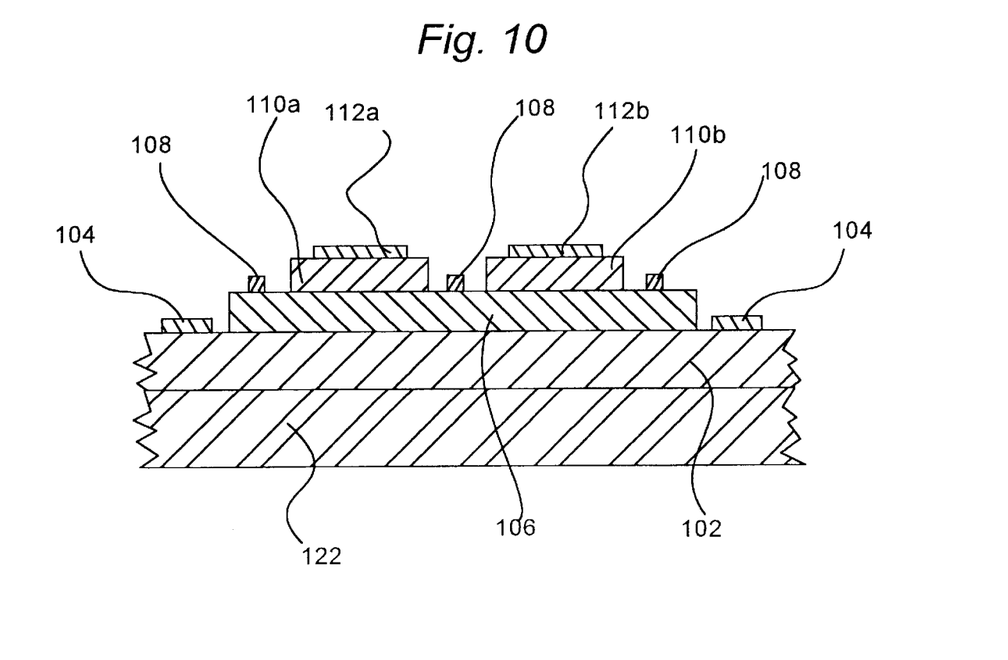
FIG. 10 is a cross-sectional view taken along line X—X shown in FIG. 9.

FIG. 10 is a cross-sectional view taken along line X—X shown in FIG. 9.

As shown in FIG. 10, reference numeral 122 designates a GaAs substrate.

The basic HBT 120 shown in FIGS. 9 and 10 is formed from two emitters in order to reduce the thermal resistance $\Theta TH$.

Two types of multi-finger HBTs are prepared: namely, a multi-finger HBT which has a single emitter 112 provided between collectors 104, as does the basic HBT 100; and a multi-finger HBT which has two emitters 112 provided between collectors 104, as does the basic HBT 120. In order to examine occurrence of thermal nonuniformity, an I–V characteristic obtained when a collector voltage Vc is changed while a base current is maintained constant is obtained as a base current parameter.

Figure 11:
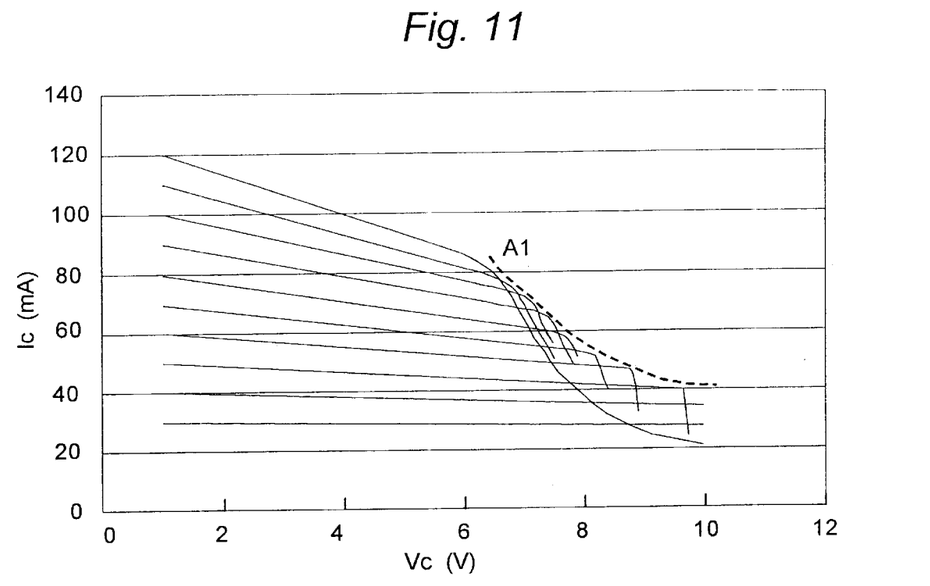
FIG. 11 is a graph showing the I–V characteristic of a multi-finger HBT using the basic HBT made of a single emitter.
Figure 12:
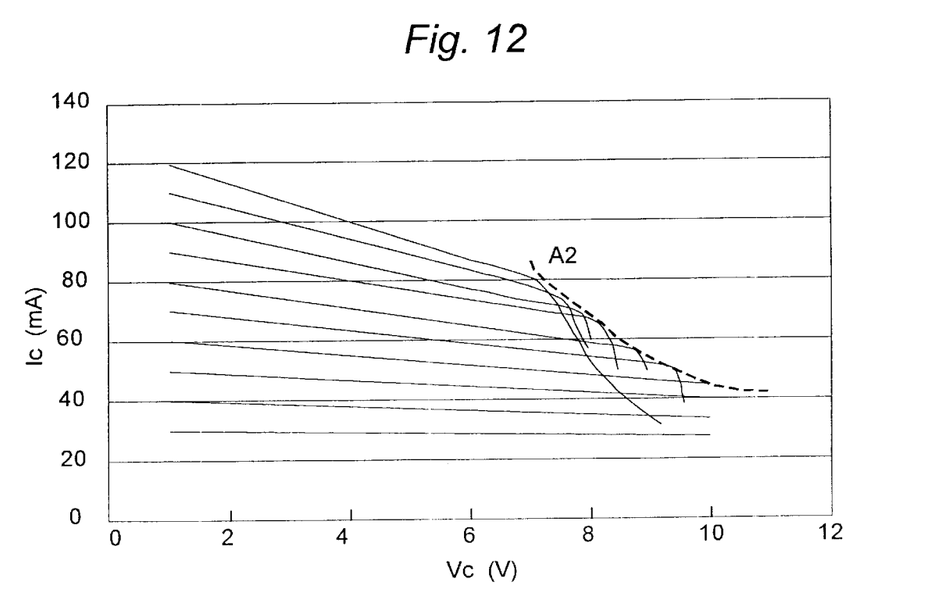
FIG. 12 is a graph showing the I–V characteristic of a multi-finger HBT using the basic HBT made of two emitters.

FIG. 11 is a graph showing the I–V characteristic of a multi-finger HBT using the basic HBT 100 made of a single emitter. FIG. 12 is a graph showing the I–V characteristic of a multi-finger HBT using the basic HBT 120 made of two emitters.

As shown in FIGS. 11 and 12, a gradual reduction arises in an electric current within a range of small power dissipation; i.e., a range of Vc<6-volts or thereabouts, because negative feedback is applied from a power source to the HBTs 100 and 120 for reasons of temperature characteristics of current gain $\beta$ of the basis HBT. In terms of such a characteristic, no difference is present between the multi-finger HBT using the basic HBT 100 made of a single emitter and the multi-finger HBT using the basic HBT 120 made of two emitters.

However, within a range of large power dissipation, i.e., a range of Vc=6V or greater, the basic HBT 100 comprising a single emitter causes breakdown of a collector current Ic at a voltage Vc lower than that at which the basic HBT 120 comprising two emitters causes breakdown of the collector current Ic. In other words, the basic HBT 100 causes breakdown of the collector current Ic in a range of power dissipation lower than that in which the basic HBT 120 causes breakdown of the collector current Ic. Broken lines A1 shown in FIG. 11 designate a boundary within which concentration of electric current onto the basic HBT 100 arises under the foregoing conditions. Broken lines A2 shown in FIG. 12 designate a boundary within which concentration of electric current the basic HBT 120 arises under the foregoing conditions. The broken lines A2 shown in FIG. 12 are clearly shifted toward a higher Vc range than the broken lines A1 shown in FIG. 11.

Separating an emitter to be provided between collectors into a plurality of pieces is effective for preventing occurrence of thermal nonuniformity in basic HBTs.

However, if an emitter has a plurality of parts, an area for separation must be ensured between the emitter electrodes 112a and 112b. The area of a junction between the base layer 106 and the collector layer 102 becomes large, thereby increasing the capacitance of a p-n junction. An increase in the capacitance of the p-n junction deteriorates high-frequency characteristics of a semiconductor device, thereby resulting in a decrease in gain.

Japanese Patent Application Laid-Open No. Hei. 11-102916 describes a bipolar transistor which comprises a plurality of single emitters and in which first stages of a multi-stage amplifier are connected in shunt with each other. Further, there is described proper use of a bipolar transistor of single emitter structure and a bipolar transistor of multi-emitter structure, as appropriate. However, none of the transistors correspond to a heterojunction silicon transistor.

SUMMARY OF THE INVENTION

The present invention has been conceived to overcome such a drawback and is aimed at providing a high-frequency semiconductor device having an amplifier circuit, which amplifier minimizes deterioration of a high-frequency characteristic and attains high thermal stability.

According to one aspect of the present invention, a high-frequency semiconductor device comprises a first portion of an amplifier circuit and a second portion of the amplifier circuit, which amplifies a signal output from the first portion. The first portion of an amplifier circuit is formed by means of connecting a plurality of first bipolar transistors having a hetero-junction structure in shunt with each other and is provided on a first semiconductor substrate. The second portion of the amplifier circuit is formed by means of connecting a plurality of second bipolar transistors having a hetero-junction structure in shunt with each other and being provided on a second semiconductor substrate. Further, each of the second bipolar transistors has a larger number of emitter electrodes than do the first bipolar transistor.

Accordingly, a high-frequency semiconductor device according to the present invention is advantageous in that an increase in the capacity of a p-n junction between the base layer and the collector layer of each of transistors provided in a front stage of an amplifier circuit is prevented, and that occurrence of non-uniform operations of transistors provided in a subsequent stage of an amplifier circuit having great output power can be prevented. By extension, there can be constituted a high-frequency semiconductor device which minimizes deterioration of a high-frequency characteristic and has high thermal reliability.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference number.

DESCRIPTION OF THE PREFERRED EMBODIMENT

The following embodiment describes a multi-stage power amplifier for example. The present embodiment describes a power amplifier comprising a driver stage and a output stage. The driver stage is formed into a multistage multi-finger HBT in which basic HBTs having a single emitter are connected in shunt with each other. The output stage is formed into a single stage multi-finger HBT in which basic HBTs having two emitters are connected in shunt with each other. While an increase in the capacity of a p-n junction between an emitter layer and a base layer of the driver stage is prevented, thermal non-uniformity arising in the output stage is diminished. In turn, thermal stability of the power amplifier is enhanced without deterioration of a high-frequency characteristic of the power amplifier.

Figure 1:
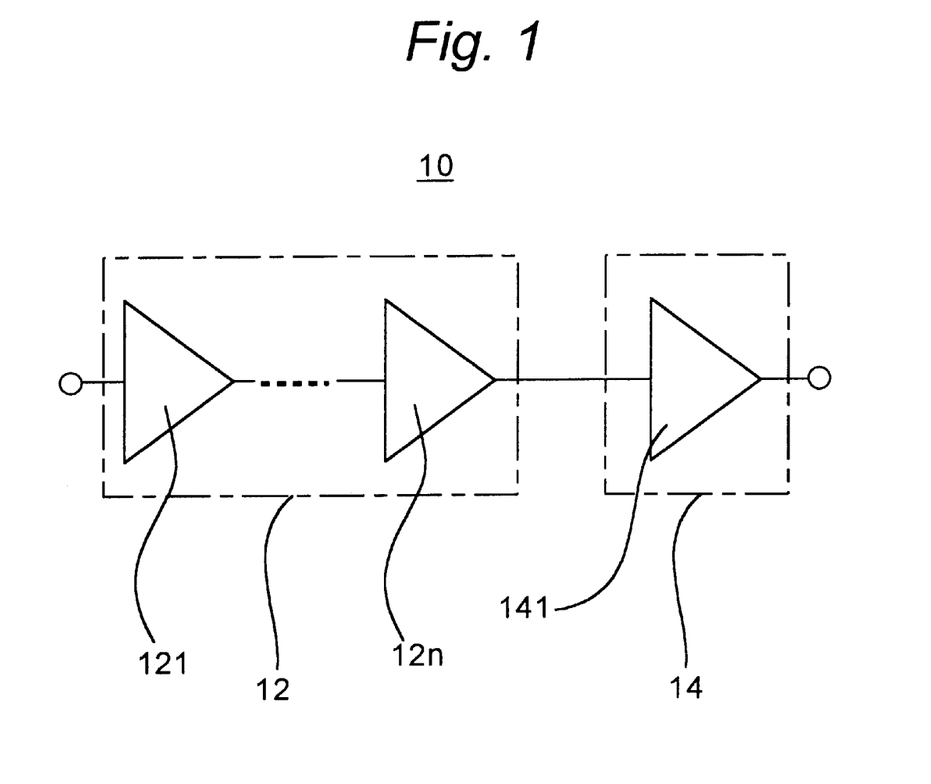
FIG. 1 is a circuit diagram showing a power amplifier according to the present invention.

FIG. 1 is a circuit diagram showing a power amplifier according to the present embodiment.

In connection with FIG. 1, reference numeral 10 designates a multi-stage power amplifier; 12 designates a driver stage of a first portion of the power amplifier 10; 121 designates a first transistor of the driver stage 12; and 12n designates an n$^{th}$ transistor of the driver stage 12. Transistors 121 through 12n are connected in series.

Reference numeral 14 designates an output stage serving as a second portion of the power amplifier 10. The output stage 14 is formed from a single output transistor 141.

Figure 2:
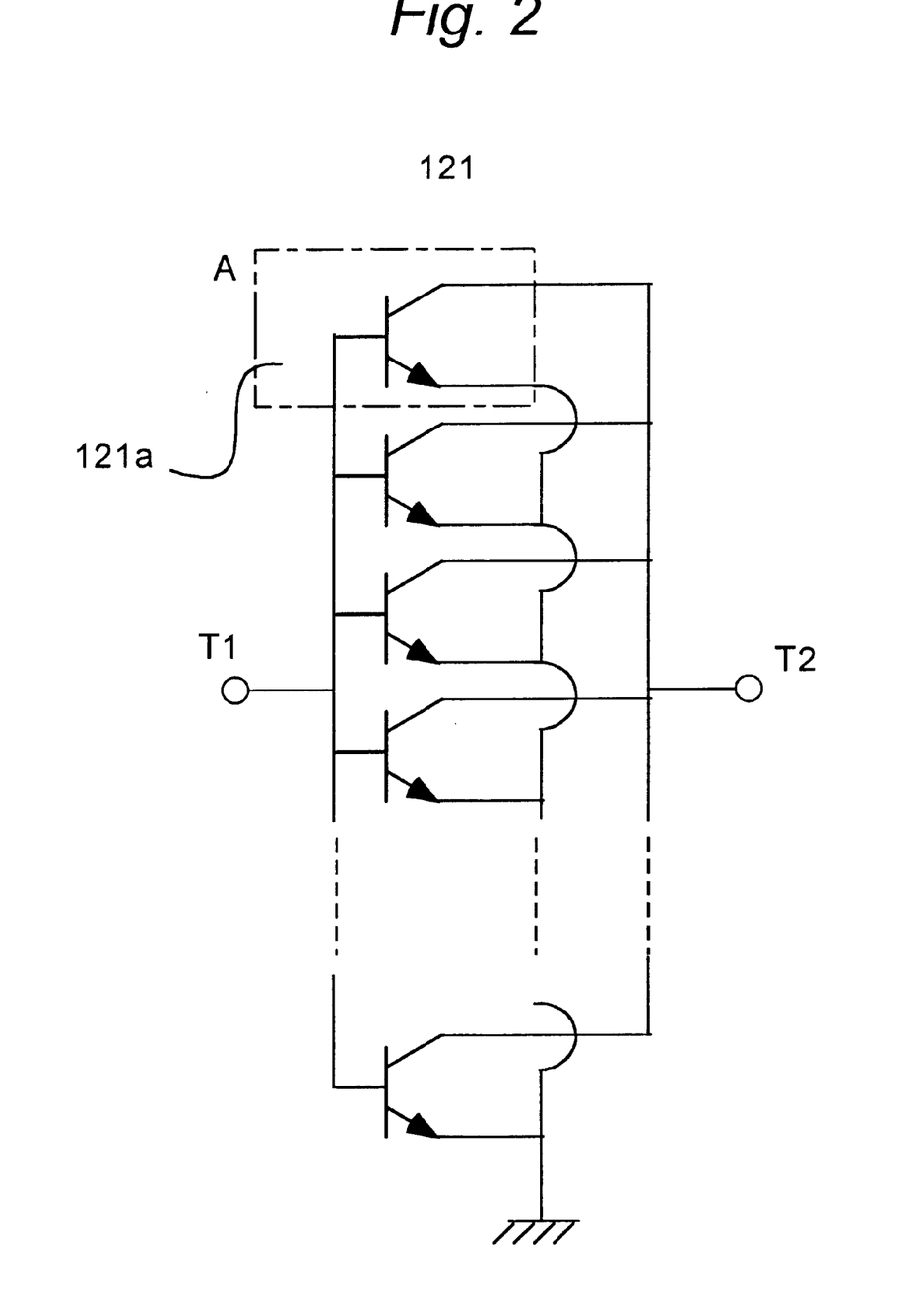
FIG. 2 is a circuit diagram showing a single transistor constituting the driver stage of the power amplifier according to the present invention.

FIG. 2 is a circuit diagram showing a single transistor constituting the driver stage 12 of the power amplifier 10; for example, a first transistor 121.

In connection with FIG. 2, section A denotes a basic HBT 121a. The basic HBT 121a corresponds to a single emitter HBT made of a single emitter electrode.

The first transistor 121 is formed by means of connecting a plurality of basic HBTs 121a in shunt with each other. The gate electrode of the first transistor 121 is connected to an input terminal T1, and the collector electrode of the first transistor 121 is connected to an output terminal T2. Further, the emitter electrode of the first transistor 121 is grounded.

Figure 3:
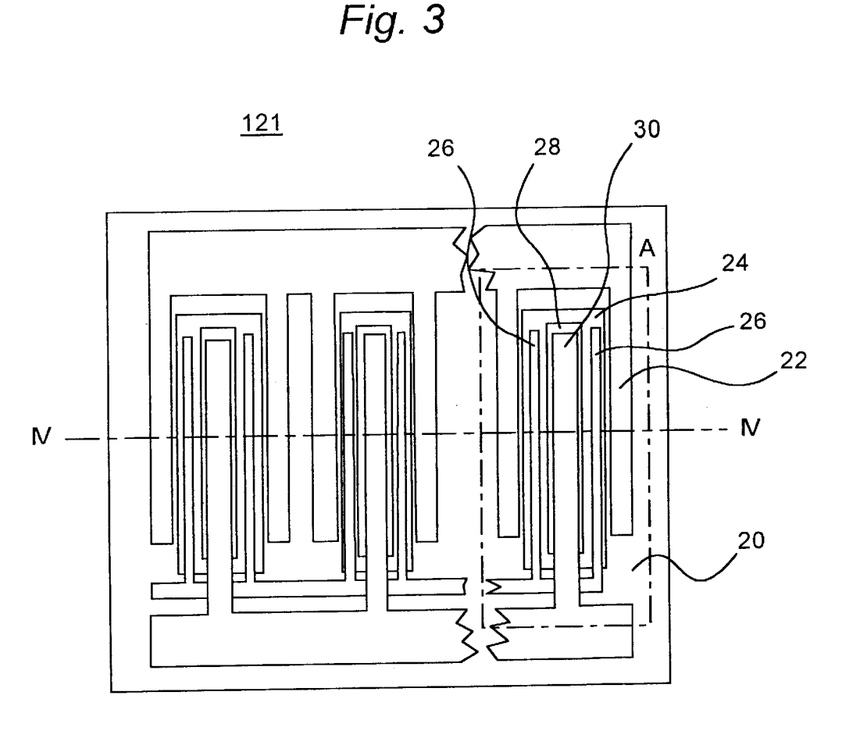
FIG. 3 is a plan view showing one of the transistors constituting the driver stage of the power amplifier according to the present invention.

FIG. 3 is a plan view showing one of the transistors constituting the driver stage 12 of the power amplifier 10; for example, the first transistor 121. Section A enclosed by dotted lines shown in FIG. 3 designates the basic HBT 121a serving as a first bipolar transistor. Further, FIG. 4 is a cross-sectional view taken along line IV—IV shown in FIG. 3.

Figure 4:
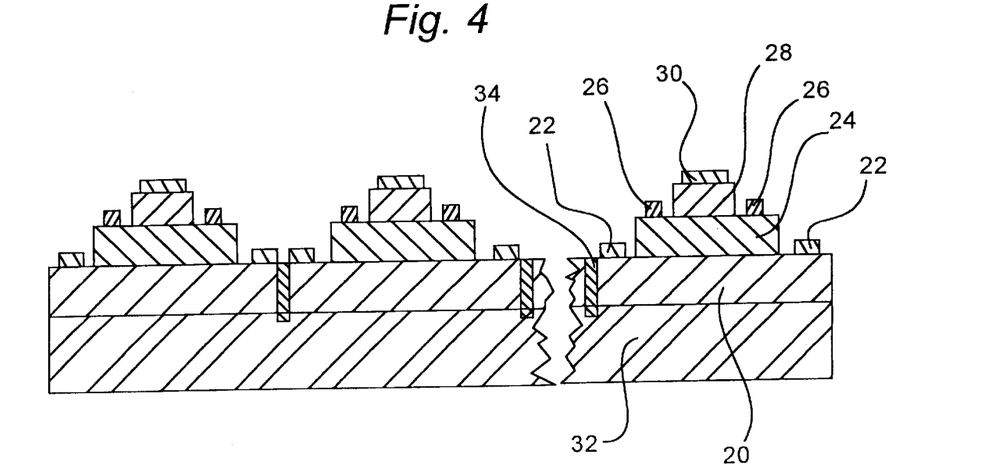
FIG. 4 is a cross-sectional view taken along line IV—IV shown in FIG. 3.

In connection with FIGS. 3 and 4, reference numeral 20 designates a collector layer which is formed from an n$^{+}$-GaAs layer with an impurity doping level of $2 \times 10^{16}$ cm$^{-3}$ or thereabouts and has a thickness of about 10000 angstroms. Reference numeral 22 designates a collector electrode.

Reference numeral 24 designates a base layer which is laid on the surface of the collector layer 20 and is provided between two collector electrodes 22. The base layer 24 is formed from a p$^{+}$-GaAs layer with an impurity doping level of $5 \times 10^{19}$ cm$^{-3}$ or thereabouts and has a thickness of about 1000 angstroms. Reference numeral 26 designates a base electrode laid on the surface of the base layer 24.

Reference numeral 28 designates an emitter layer which is laid on the surface of the base layer 24 so as to become provided between the two base electrodes 26. The emitter layer 28 is formed from an n-AlGaAs layer with an impurity doping level of $2 \times 10^{17}$ cm$^{-3}$ or thereabouts and has a thickness of about 700 angstroms. Reference numeral 30 designates an emitter electrode laid on the surface of the emitter layer 28.

In the HBT, the emitter layer is formed from a semiconductor, in which semiconductor the band gap of an emitter layer is wider than that of the base layer, by means of a heterojunction. The presence of a heterojunction prevents reverse injection of positive holes from the base electrode to the emitter electrode, thereby attaining a high current gain β.

As shown in FIG. 4, reference numeral 32 designates a GaAs substrate serving as a first semiconductor substrate, and the collector layer 20 is laid on the surface of the GaAs substrate 32. Reference numeral 34 designates an isolator for isolating the basic HBT 121a. The isolator 34 is formed by means of implantation of H$^+$ ions. The isolator 34 extends from the surface of the collector layer 20 to the GaAs substrate 32 by means of penetration of the collector layer 20.

Figure 5:
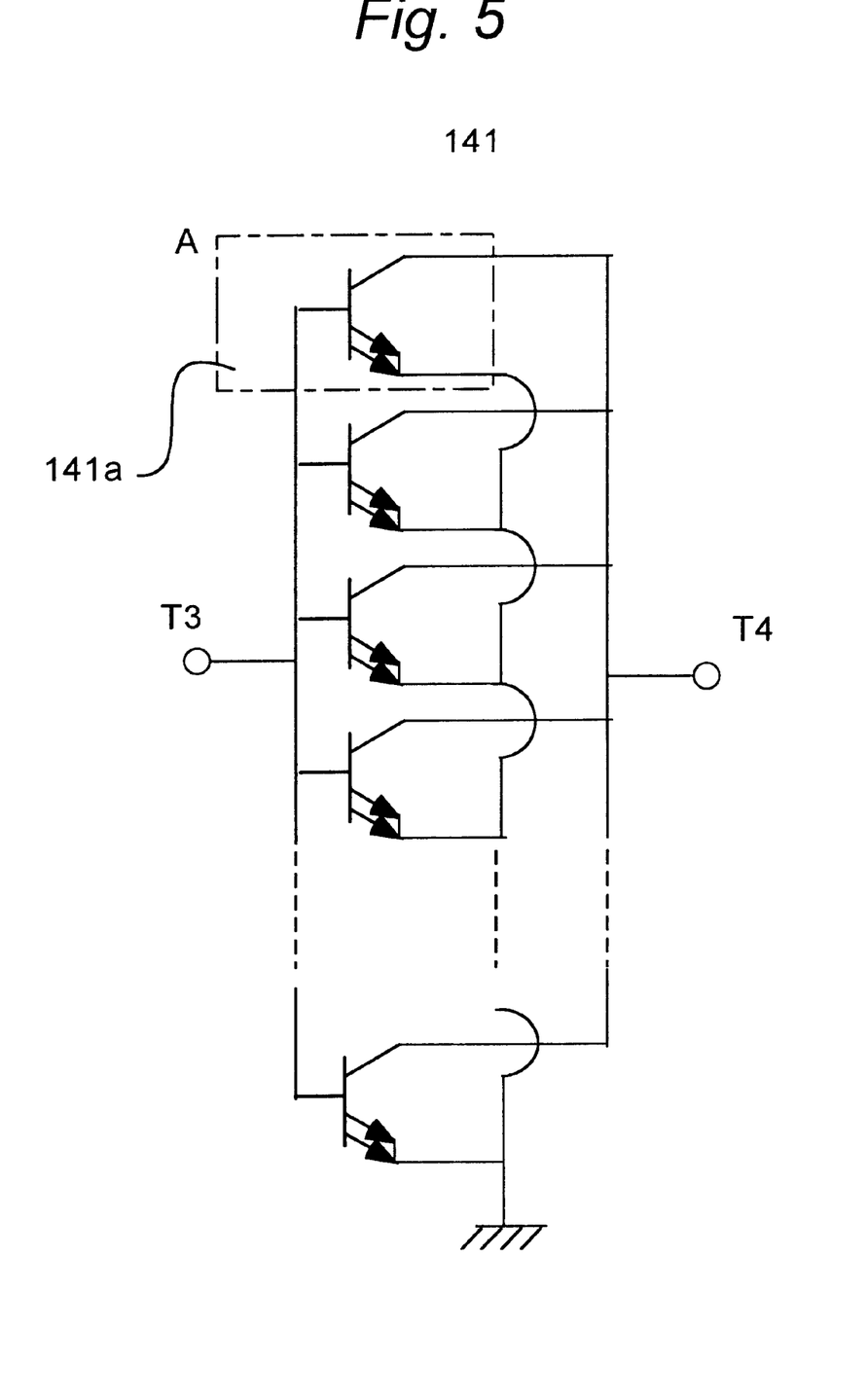
FIG. 5 is a circuit diagram showing one of the transistors constituting the output stage of the power amplifier according to the present invention.

FIG. 5 is a circuit diagram showing one of the transistors constituting the output stage 14 of the power amplifier 10. Here, the circuit diagram shows an output transistor 141.

Section A enclosed by chain lines shown in FIG. 5 denotes a basic HBT 141a. The basic HBT 141a is a multi-emitter HBT made of two emitter electrodes.

The output transistor 141 is constituted by means of connecting a plurality of basic HBTs 141a in shunt with each other. The gate electrode of the output transistor 141 is connected to an input terminal T3, and the collector electrode of the output transistor 141 is connected to an output terminal T4. The emitter electrode of the output transistor 141 is grounded.

Figure 6:
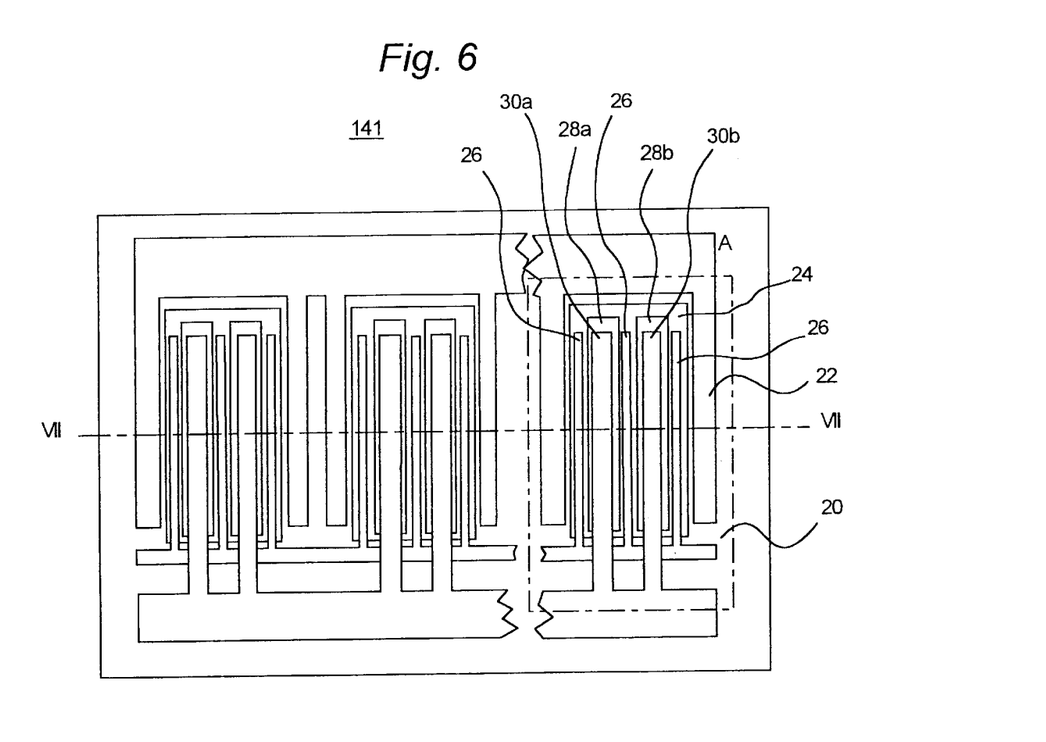
FIG. 6 is a plan view showing one of the transistors constituting the output stage of the power amplifier according to the present invention.

FIG. 6 is a plan view showing one of the transistors constituting the output stage 14 of the power amplifier 10. Here, FIG. 6 shows the output transistor 141. Section A enclosed by chain lines shown in FIG. 6 denotes a basic HBT 141a serving as a second bipolar transistor. Further, FIG. 7 is a cross-sectional view taken along line VII—VII shown in FIG. 6.

Figure 7:
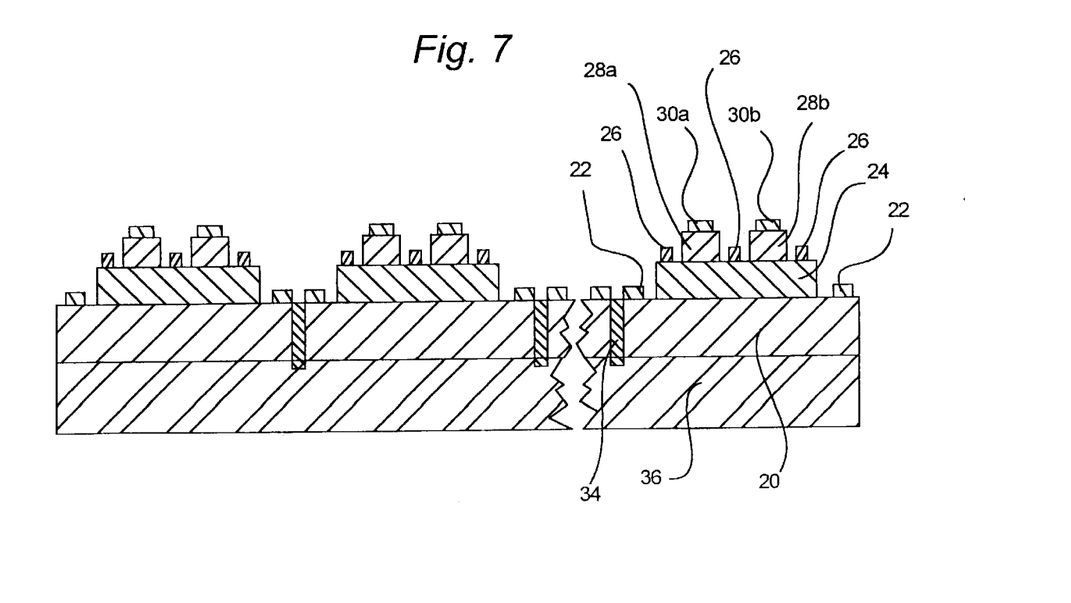
FIG. 7 is a cross-sectional view taken along line VII—VII shown in FIG. 6.

As shown in FIGS. 6 and 7, the emitter layer 28 is divided into emitter layers 28a and 28b. An emitter electrode 30a is laid on the surface of the emitter layer 28a, and an emitter electrode 30b is laid on the surface of the emitter layer 28b. The HBT 141a is identical with the basic HBT 121 in terms of materials and thickness of respective layers constituting the HBT, except that more one of the base electrode 26 is provided between the emitter layers 28a and 28b. Reference numeral 36 designates a GaAs substrate serving as a second semiconductor substrate.

In FIGS. 6 and 7, those reference numerals which are the same as those shown in FIGS. 3 and 4 designate the same or corresponding elements.

Needless to say, the design of a basic HBT or the number of HBTs may be determined as appropriate, except that the number of emitters of a basic HBT provided in the output stage 14 is made larger than the number of emitters of a basic HBT provided in the driver stage 12.

As shown in FIGS. 6 and 7, two emitter layers 28a and 28b are laid on the surface of the base layer 24 so as to be provided between three base electrodes 26 laid on the surface of the base layer 24 in a staggered arrangement. An emitter electrode 30a is laid on the surface of the emitter layer 28a, and an emitter electrode 30b is laid on the surface of the emitter layer 28b. The basic HBT 141a is isolated by the isolator 34.

One of the base electrode 26 is interposed between the emitter layers 28a and 28b for reducing the resistance of the base.

In order to produce output power of 1 W, the power amplifier 10 requires a total emitter area of 3000 μm$^2$ or more. Provided that an emitter assumes a total area of 3000 μm$^2$ and the basic HBT has an emitter area of 80 μm$^2$, the output transistor 141 is formed by means of connecting 38 HBTs 141a in shunt with each other, each basic HBT 141a having an emitter layer divided into two emitter electrodes 30a and 30b.

As described by reference to FIGS. 11 and 12, the HBT having two emitters is less susceptible to breakdown of a collector current than is the HBT having a single emitter. For this reason, concentration of an electric current is less likely to arise in the output transistor 141 constituted by means of connecting a plurality of basic HBTs 141a in shunt with each other. Accordingly, the output stage 14 can prevent occurrence of thermally-nonuniform operation between the basic HBTs 141a.

The power output from the driver stage 12 is determined by the power gain of the output transistor 141 provided on the output stage 14. In a case where the output transistor 141 has a power gain of 10 dB or thereabouts, the driver stage 12 must have output power exceeding one-tenth that of the output transistor 141. In short, the driver stage 12 must have an output power of 100 mW or more.

Since desired output power of each of the transistors 121 to 12n provided in the driver stage 12 is small, each transistor can be constituted by means of connecting only five to eight basic HBTs in shunt with each other.

As mentioned above, the basic HBTs constituting each of the transistors provided in the driver stage 12 are considerably smaller in number than are the basic HBTs constituting an output transistor. Therefore, thermally-nonuniform operation is less likely to arise between basic HBTs.

Consequently, prevention of occurrence of thermally-nonuniform operation between basic HBTs can be made feasible, thereby obviating a further necessity of employing a multi-emitter structure which involves deterioration of a high-frequency characteristic, which would otherwise be caused by an increase in the area of a p-n junction and an increase in the capacity of the p-n junction. For this reason, basic HBTs constituting each of the first transistor 121 to the n$^{th}$ transistor 12n of the driver stage 12 may be embodied by the basic HBT 121a of single emitter structure, thereby preventing deterioration of a high-frequency characteristic.

In the power amplifier 10 according to the present embodiment, basic HBTs constituting each of the n$^{th}$ transistor 12n of the driver stage 12 are embodied by the basic HBT 121a of single emitter structure. Further, the output transistor 141 provided on the output stage 14 is constituted by means of connecting a plurality of basic HBTs 141a of multi-emitter structure in shunt with each other. As a result, concentration of an electric current becomes unlikely to arise in the output stage 14, thereby preventing occurrence of thermally non-uniform operation between the basic HBTs. On the driver stage in which thermally non-uniform operations are less likely to arise between basic HBTs, a transistor provided on a driver stage is constituted of HBTs of single emitter structure, thereby preventing deterioration of high-frequency characteristic of the power amplifier. In terms of the power amplifier as a whole, occurrence of a thermally non-uniform operation between basic HBTs is prevented, and deterioration of a high-frequency characteristic of the power amplifier is prevented.

Further, there is employed a heterojunction structure made of GaAs and AlGaAs. GaAs material has higher electron mobility than does Si, thereby embodying a faster bipolar transistor.

As a result of a driver stage being made of the same substrate as that of an output stage, there can be embodied a compact high-performance amplifier.

In the previous embodiment, the driver stage is embodied as a multi-finger HBT made up of basic HBTs of single emitter structure, and the output stage is embodied as a multi-finger HBT made up of basic HBTs of multi-emitter structure. However, the driver stage and the output stage are not necessarily limited to these structures. Depending on power gain, a front stage may be simply formed into a multi-finger HBT made of basic HBTs of single emitter structure, and a subsequent stage may be simply formed into a multi-finger HBT made of basic HBTs of multi-emitter structure.

Alternatively, a power amplifier may be constituted such that a driver stage and an output stage are formed into a multi-finger HBT made of basic HBTs of multi-emitter structure and such that the number of emitters of each basic HBT provided in the output stage is made greater than that of each basic HBT provided in the driver stage.

The high-frequency semiconductor device according to the present invention has the foregoing structure and yields the following advantages.

Specifically, the high-frequency semiconductor device comprises a first portion of an amplifier circuit which is embodied by means of connecting a plurality of first bipolar transistors in shunt with each other and is provided on a first semiconductor substrate, each of the first bipolar transistors having a heterojunction structure; and a second portion of the amplifier circuit which amplifies a signal output from the first portion, has a heterojunction structure, is formed by means of connecting a plurality of second bipolar transistors in shunt with each other, and is provided on a second semiconductor substrate, each of the second bipolar transistors having a larger number of emitter electrodes than do the first bipolar transistor. As a result, while an increase in the capacity of a p-n junction between the base layer and the collector layer of each of transistors provided in a front stage of an amplifier circuit is prevented, occurrence of nonuniform operations of transistors provided in a subsequent stage of an amplifier circuit having great output power can be prevented. By extension, there can be constituted a high-frequency semiconductor device which minimizes deterioration of a high-frequency characteristic and has high thermal reliability.

Preferably, the first portion of the amplifier circuit corresponds to a driver stage, and the second portion of the amplifier circuit corresponds to an output stage. As a result, while an increase in the capacity of a p-n junction between the base layer and the collector layer of each transistor provided in a driver stage of an amplifier circuit is prevented, occurrence of nonuniform operations of transistors provided in an output stage of an amplifier circuit having the highest output power can be prevented. By extension, there can be constituted a high-frequency semiconductor device which minimizes deterioration of a high-frequency characteristic and has effectively-enhanced thermal reliability.

Preferably, the emitter layer of the bipolar transistor is formed from AlGaAs, and the base layer is formed from GaAS. Hence, the bipolar transistor enables high-speed operation. Consequently, there can be constituted a high-frequency semiconductor device having superior high-speed performance and high thermal reliability.

Preferably, the first semiconductor and the second semiconductor are integrally formed into a single piece. Therefore, the amplifier circuit can be made compact. In turn, there can be constituted a compact high-frequency semiconductor device.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-261329, filed on Aug. 30, 2000 including specification, claims, drawings and summary, on which the Convention priority of the present application is based, are incorporated herein by reference in its entirety.

What is claimed is:

1. A high-frequency semiconductor device comprising:
   first and second semiconductor substrates;
   an amplifier circuit including
      a driver amplifier comprising a plurality of first heterojunction bipolar transistors, each first heterojunction bipolar transistor having a respective emitter electrode, base electrode, and collector electrode, the first heterojunction bipolar transistors being connected in shunt with each other and located on the first semiconductor substrate; and
      an output amplifier amplifying a signal output from the collector electrodes of the driver amplifier, the output amplifier of the amplifier circuit including a plurality of second heterojunction bipolar transistors connected in shunt with each other, each second heterojunction bipolar transistor having a respective collector electrode, a respective base electrode, and a plurality of emitter electrodes, wherein the base electrode is connected to the collector electrodes of the first heterojunction bipolar transistors, the emitter electrodes are grounded, and the output amplifier is located on the second semiconductor substrate.

2. The high-frequency semiconductor device according to claim 1, wherein each of the first and second heterojunction bipolar transistors includes an emitter layer of AlGaAs and a base layer of GaAs.

3. The high-frequency semiconductor device according to claim 1, wherein the first semiconductor substrate and the second semiconductor substrate are a single semiconductor substrate.

4. The high-frequency semiconductor device according to claim 2, wherein the first semiconductor substrate and the second semiconductor substrate are a single semiconductor substrate.

5. The high-frequency semiconductor device according to claim 1, wherein the first semiconductor substrate and the second semiconductor substrate are separate semiconductor substrates.

6. The high-frequency semiconductor device according to claim 2, wherein the first semiconductor substrate and the second semiconductor substrate are separate semiconductor substrates.

7. The high-frequency semiconductor device of claim 1, wherein each of the second heterojunction bipolar transistors has a larger number of the emitter electrodes than the first heterojunction bipolar transistors.

8. The high-frequency semiconductor device of claim 7, wherein each first heterojunction bipolar transistor has a single emitter electrode and each second heterojunction bipolar transistor has two emitter electrodes.

9. The high-frequency semiconductor device according to claim 1, wherein the output amplifier has an output port connected to the collector electrodes of each of the second heterojunction bipolar transistors.

* * * * *